(12) United States Patent
Ruby

(10) Patent No.: US 6,377,137 B1
(45) Date of Patent: Apr. 23, 2002

(54) ACOUSTIC RESONATOR FILTER WITH REDUCED ELECTROMAGNETIC INFLUENCE DUE TO DIE SUBSTRATE THICKNESS

(75) Inventor: Richard C. Ruby, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 16 days.

(21) Appl. No.: 09/659,254

(22) Filed: Sep. 11, 2000

(51) Int. Cl.$^7$ .............................. H03H 9/54; H03H 9/58; H03H 3/02
(52) U.S. Cl. ....................... 333/189; 333/187; 310/321; 310/324; 310/348; 29/25.35; 438/959
(58) Field of Search ................................ 333/186–192; 310/321, 324, 348; 29/25.35; 216/52; 438/959

(56) References Cited

U.S. PATENT DOCUMENTS

| | | | |
|---|---|---|---|
| 5,034,753 A | * 7/1991 | Weber | 343/846 |
| 5,153,476 A | 10/1992 | Kosinski | 310/313 |
| 5,166,646 A | 11/1992 | Avanic et al. | 331/107 |
| 5,233,259 A | 8/1993 | Krishnaswamy et al. | 310/324 |
| 5,382,930 A | * 1/1995 | Stokes et al. | 333/191 |
| 5,446,306 A | 8/1995 | Stokes et al. | 257/416 |
| 5,587,620 A | 12/1996 | Ruby et al. | 310/346 |
| 5,666,706 A | * 9/1997 | Tomita et al. | 29/25.35 |
| 5,692,279 A | * 12/1997 | Mang et al. | 29/25.35 |
| 5,714,917 A | 2/1998 | Ella | 332/114 |
| 5,780,713 A | 7/1998 | Ruby | 73/1.82 |
| 5,853,601 A | * 12/1998 | Krishaswamy et al. | 216/2 |
| 5,873,153 A | 2/1999 | Ruby et al. | 29/25.35 |
| 5,883,575 A | 3/1999 | Ruby et al. | 340/572.5 |
| 6,060,818 A | 5/2000 | Ruby et al. | 310/363 |

FOREIGN PATENT DOCUMENTS

JP     2000-69594     * 3/2000

OTHER PUBLICATIONS

Integrated Continuous–Time Filters: Principles, Design, and Applications, edited by Y.P. Tsividis, National Technical University of Athens and J. O. Voorman, Philips Research Laboratories (14 pages) Reprinted From IEE Proceedings, vol. 136, Pt. G, pp. 184–190, Aug. 1989.

* cited by examiner

Primary Examiner—Benny Lee
Assistant Examiner—Barbara Summons

(57) ABSTRACT

A plurality of acoustic resonators are manufactured in a batch process by forming cavities in a substrate and filling the cavities with a sacrificial layer. An FBAR membrane comprising a bottom electrode, a piezoelectric layer, and a top electrode is formed over each cavity and the sacrificial layer. The substrate is then thinned and the substrate is separated into a plurality of dice using a scribe and break process. The sacrificial layer is then removed and the FBAR filter is mounted in a package with thermal vias being thermal communication with underside of the FBAR filter. The production method improves thermal properties by increasing the efficiency of heat dissipation from the FBAR filter. In addition, electromagnetic interference is decreased by reducing the distance between a primary current flowing over the surface of the FBAR filter and an image current flowing in a ground plane beneath the FBAR filter.

20 Claims, 5 Drawing Sheets

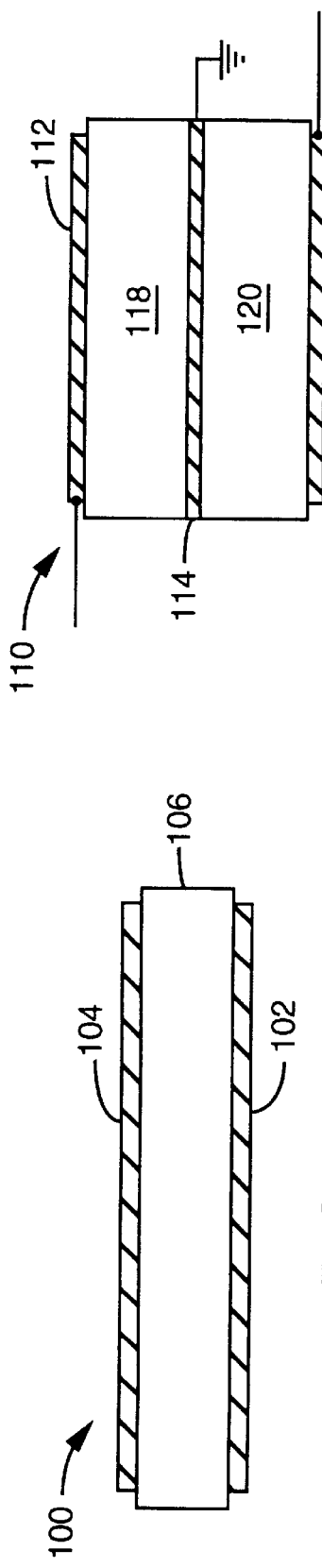
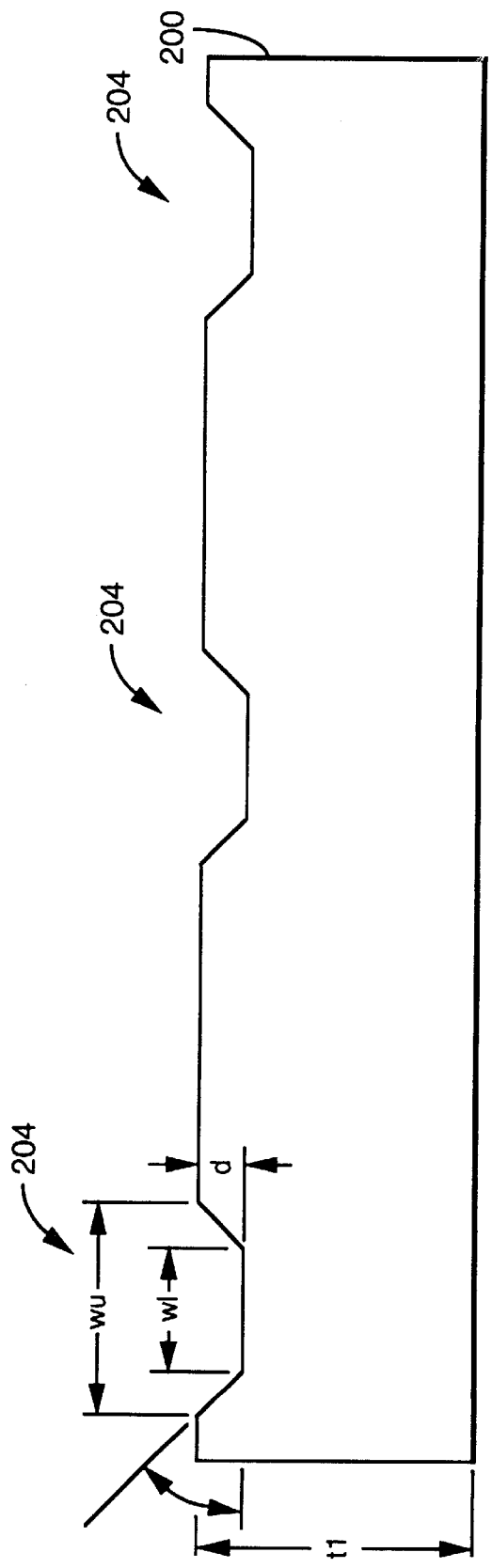

ACOUSTIC RESONATOR FILTER WITH REDUCED ELECTROMAGNETIC INFLUENCE DUE TO DIE SUBSTRATE THICKNESS

FIELD OF THE INVENTION

This invention relates to the manufacturing of acoustic resonators, and, more particularly, to the manufacturing of resonators that may be used as filters for electronic circuits.

BACKGROUND

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of piezoelectric material is sandwiched between two metal electrodes. The sandwich structure is suspended in air by supporting it around the perimeter. When an electric field is created between the two electrodes via an impressed voltage, the piezoelectric material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 $\mu$m in diameter and few $\mu$m in thickness.

Thin Film Bulk Acoustic Resonators (FBARs) and Stacked Thin Film Bulk Wave Acoustic Resonators and Filters (SBARs) include a thin sputtered piezoelectric film having a thickness on the order of one to two $\mu$m. Electrodes on top and bottom sandwich the piezoelectric acting as electrical leads to provide an electric field through the piezoelectric. The piezoelectric, in turn, converts a fraction of the electric field into a mechanical field. A time varying "stress/strain" field will form in response to a time-varying applied electric field.

To act as a resonator, the sandwiched piezoelectric film is suspended in air to provide the air/crystal interface that traps the sound waves within the film. The device is normally fabricated on the surface of a substrate by depositing a bottom electrode, the piezoelectric layer, and then the top electrode. Hence, an air/crystal interface is already present on the topside of the device. A second air/crystal interface must be provided on the bottom side of the device. There are several approaches for obtaining this second air/crystal interface. Some of these approaches are described in U.S. Pat. No. 6,060,818 to Ruby et al., incorporated herein by reference in its entirety.

It is possible to manufacture a plurality of FBARs on a single substrate, such as a four inch diameter single crystal silicon wafer. The substrate is then diced to separate the multiple FBARs manufactured thereon. However, the process of sawing the substrate can damage the extremely thin FBAR resonators, so care must be taken during the dicing step.

There is a need for an improved process for manufacturing acoustical resonator structures. In particular, there is a need for an improved batch processing method for producing FBARs and SBARs.

SUMMARY

In accordance with the invention, a method for batch processing acoustic resonators includes: depositing a first electrode on a top surface of a substrate; depositing a layer of piezoelectric material on said first electrode; depositing a second electrode on said layer of piezoelectric material; and removing material from a bottom surface of said substrate to reduce the thickness of the substrate and to reduce an electromagnetic influence in a resulting filter.

In accordance with another embodiment of the present invention, an acoustic filter is provided. The acoustic filter includes: a die substrate having a cavity formed on an upper surface thereof, said die substrate having a thickness of less than 19 mils; a plurality of resonator membranes formed on said die substrate. Each of said plurality of resonator membranes comprises a first electrode provided over said cavity on said upper surface of said die substrate; a piezoelectric material provided over said first electrode; and a second electrode provided over said piezoelectric material. A plurality of interconnects are provided on said die substrate providing electrical connections between said plurality of resonator membranes. A package is provided, the package including a die cavity formed on an upper surface thereof, said die substrate being mounted in said die cavity such that a primary current flowing along an upper surface of said die substrate creates a primary current magnetic field and an image current flowing along a ground plane beneath said die substrate creates an image current magnetic field, said primary current magnetic field and said image current magnetic field having opposite polarities.

BRIEF DESCRIPTION OF THE DRAWINGS

For a more complete understanding of the present invention and for further features and advantages, reference is now made to the following description taken in conjunction with the accompanying drawings.

FIG. 1a is a cross-section of an FBAR resonator.

FIG. 1b is a cross-section of an SBAR resonator.

FIGS. 2–8 are cross-sectional views of a portion of a substrate on which an FBAR is constructed according to an embodiment of the present invention.

DETAILED DESCRIPTION OF THE PREFERRED EMBODIMENTS

Figure 3:
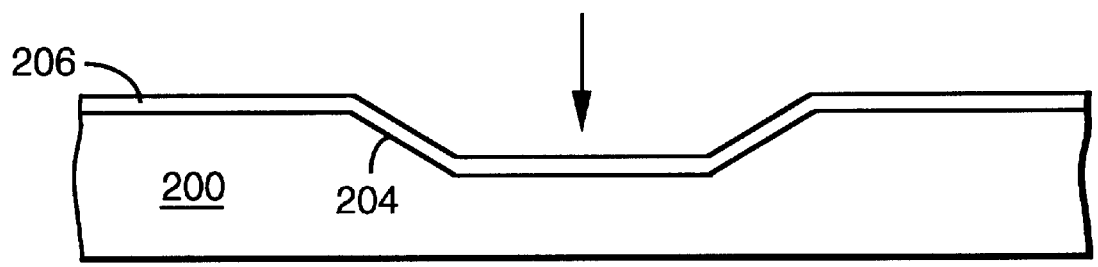

The preferred embodiments of the present invention and their advantages are best understood by referring to FIGS. 1–10 of the drawings. Like numerals are used for like and corresponding parts of the various drawings.

The present invention may be more easily understood with reference to FIGS. 1a–1b, which are cross-sectional views of an FBAR membrane 100 and SBAR membrane 110, respectively. FBAR membrane 100 includes bottom and top electrodes 102 and 104, respectively, which sandwich a portion of a sheet of piezoelectric (PZ) material 106, such as, for example, aluminum nitride, AlN. Electrodes 102, 104 used in FBAR membrane 100 are made of, for example, molybdenum. FBAR membrane 100 uses bulk longitudinal acoustic waves in the thin film piezoelectric material 106. When an electric field is created between bottom electrode 102 and top electrode 104 via an impressed voltage, piezoelectric material 106 converts some of the electrical energy into mechanical energy in the form of sound waves. The sound waves propagate in the same direction as the electric field and reflect off of the electrode/air interface.

At the mechanical resonance, FBAR membrane 100 appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions of the order of 200 $\mu$m in length and a few $\mu$m in thickness.

FIG. 1b is a cross-sectional view of an SBAR membrane 110. SBAR membrane 110 provides electrical functions analogous to those of a band-pass filter. SBAR membrane 110 is basically two FBAR membranes that are mechanically coupled. A signal across electrodes 112 and 114 at the resonance frequency of piezoelectric layer 118 will transmit acoustical energy to piezoelectric layer 120. The mechanical oscillations in piezoelectric layer 120 are converted to an electrical signal across electrodes 114 and 116 by the piezoelectric material in piezoelectric layer 120.

The manner in which FBAR and SBAR membranes are constructed according to embodiments of the present invention may be more easily understood with reference to FIGS. 2–8, which are cross-sectional views of a portion of a substrate 200 on which a plurality of FBAR membranes 217 are manufactured.

Figure 6:
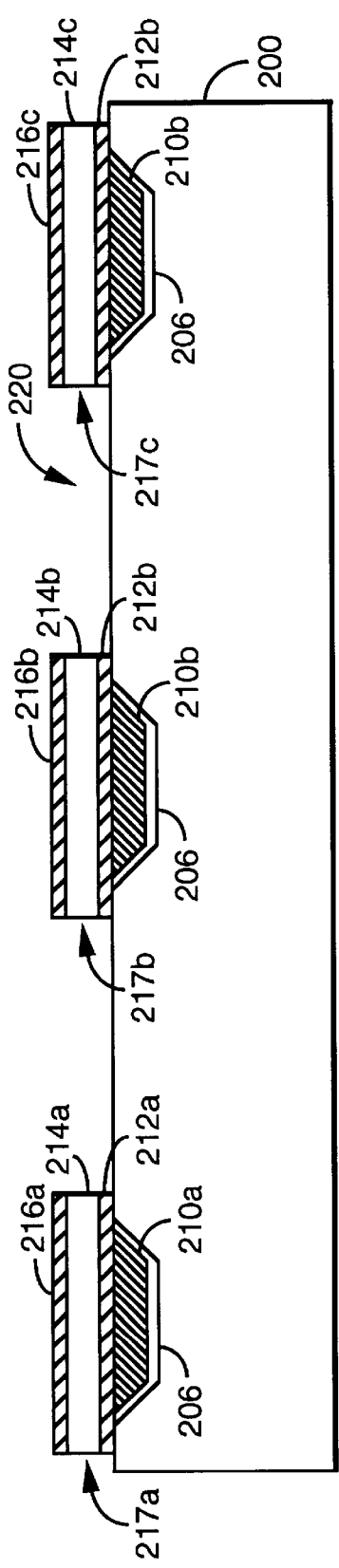

FIG. 2 shows a portion of substrate 200, which can be, for example, a conventional silicon wafer of the type utilized in integrated circuit fabrication, having a diameter of four inches and a thickness t1 of approximately 22 mils (approximately 550 $\mu$m). A plurality of cavities 204 are etched into an upper surface of substrate 200. The depth, d, of each cavity 204 should be sufficient to accommodate the displacement created by the piezoelectric layer in FBAR membrane 217 (FIG. 6). In the embodiment shown in FIG. 2, a depth, d, of approximately 5 $\mu$m is sufficient. Each cavity 204 has an upper width, $w_u$, of approximately 200 $\mu$m and a lower width, $w_l$, of approximately 193 $\mu$m.

Figure 4:
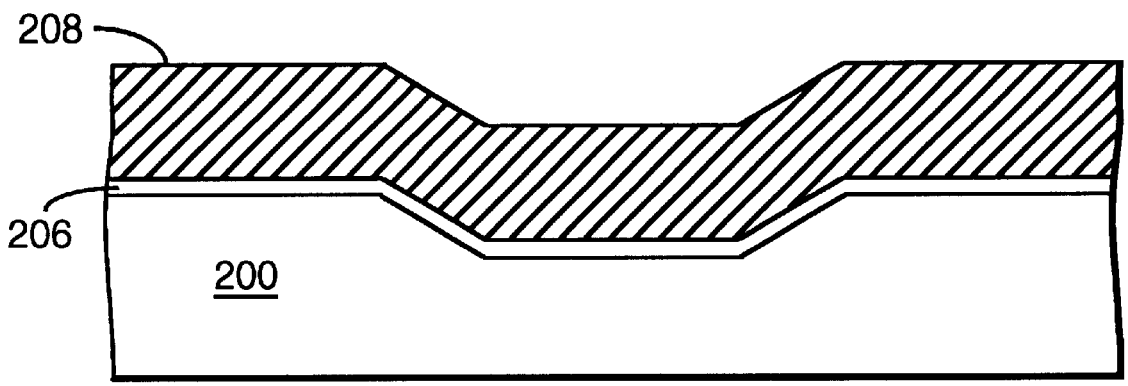
Figure 5:
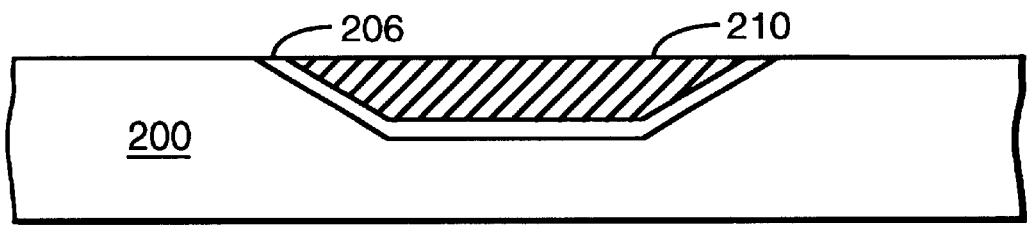

The manufacturing of FBAR membranes 217 according to this embodiment of the present invention is a batch process in which a plurality of FBAR membranes 217 are simultaneously formed on a single substrate 200. Although FIGS. 3–5 illustrate the process used to form a single FBAR membrane 217, it will be understood that the same processes are used across the surface of substrate 200 to simultaneously form a plurality of FBAR membranes 217. In addition, it will be understood that the figures are not drawn to scale. For simplicity, substrate 200 illustrated in FIGS. 3–5 appears to have a thickness t1 of roughly twice the depth, d, of cavities 204. As indicated by the exemplary dimensions described above, substrate 200 is typically considerably thicker than d.

A thin layer of thermal oxide 206 is grown on the surface of substrate 200 to prevent phosphorous from the phosphor-silica-glass (PSG) used in a subsequent step from diffusing into substrate 200. Such diffusion would convert the silicon forming substrate 200 to a conductor, which would interfere with the electrical operation of the final device.

Referring to FIG. 4, a sacrificial PSG layer 208 is then deposited over substrate 200. Sacrificial PSG layer 208 is deposited at a temperature of approximately 450° C., using silane and $P_2O_5$ to form a soft glass-like material which is approximately 8% phosphorous. This low temperature process is well known to those of ordinary skill in the art, and hence, will not be discussed in detail here. PSG is a very clean, inert material that can be deposited at relatively low temperatures and can be etched in a dilute $H_2O$:HF solution at a very high etch rate, and is therefore advantageous for usage as a sacrificial layer. At a dilution ratio of 10:1, etch rates on the order of 3 $\mu$m per minute can be obtained.

Unfortunately, a native PSG sacrificial layer is typically a poor base for constructing an acoustical resonator. At the atomic level the surface of such deposited films are atomically very rough. An acoustical resonator of the FBAR/SBAR type utilizes a piezoelectric material in which the crystals grow in columns that are perpendicular to the plane of the electrodes. In experiments, attempts to grow well-collimated piezoelectric films on the surface of a PSG layer have resulted, at best, in poor polycrystalline material that exhibits little or no piezoelectric effects because the many facets on the rough surface initiate crystal growth in a variety of directions. It has been determined that a smooth surface provides an effective base for the deposition of highly textured c-axis piezoelectric material demonstrating excellent piezoelectric properties in spite of the fact that the base does not contain a crystalline structure that "seeds" the piezoelectric layer.

Embodiments of the present invention overcome this difficulty by polishing the surface of PSG layer 208 to provide an atomically smooth surface. Referring to FIG. 5, the surface of the PSG layer 208 is first planarized by polishing with a slurry to remove the portions of PSG layer 208 and thermal oxide layer 206 outside of cavity 204. The remaining PSG portion 210 can then be polished using a more refined slurry. Alternatively, a single slurry can be used for both polishing steps. These polishing steps should create a "mirror"-like finish on top of PSG portion 210.

After polishing, substrate 200 is cleaned to remove remaining slurry or other contaminants. After polishing, the wafers are kept in de-ionized water until ready for a final cleaning step, which comprises dipping the wafers in a series of tanks that hold various cleaning agents. Each tank is subjected to ultrasonic agitation.

After cleaning, an electrode layer 212 of, for example, molybdenum, is deposited and then selectively etched to form the bottom electrode of FBAR membrane 217. Numerous alternative materials may used for electrode 212, such as Al, W, Au, Pt, or Ti. Molybdenum has a low thermo-elastic loss, making it advantageous for use in resonators. In this embodiment, the molybdenum is deposited utilizing sputtering to provide a smooth molybdenum layer that has a RMS variation in height of less than 5 nm.

After bottom electrode layer 212 has been deposited, a piezoelectric layer 214 is deposited. In one embodiment, piezoelectric layer 214 is a sputter deposited layer of AlN having a thickness between 0.1 and 10 µm. Finally, a top electrode layer 216 formed of, for example, the same material as bottom electrode layer 212, is deposited and selectively etched. Next, piezoelectric layer 214 is selectively etched such that bottom electrode layer 212, piezoelectric layer 214, and top electrode layer 216 form FBAR membrane 217. The resulting structure is shown in FIG. 6.

In conventional silicon wafer processing, after devices are formed on the wafer surface, the wafer is diced in a sawing step into a plurality of individual die. Sawing typically involves the use of a high-speed lathe in combination with a high-pressure DI water rinse to remove silicon chips and residue caused by the saw. However, FBAR membrane 217 is very thin and fragile, so this rinsing action may cause damage to FBAR membrane 217.

An alternative to wafer sawing is a process conventionally known as "scribe and cleave." A scribe, which can be, for example, a diamond cutting tip, is drawn along the upper surface of the wafer, forming a shallow groove ("scribe line") in the wafer surface. The individual die are separated by stressing the wafer at the location of the groove. The wafer tends to break at the location of the groove, following the crystal structure of the wafer. The "breaking" step can be performed by impacting the underside of the wafer along a scribe line, or by moving a cylindrical roller over a surface of the wafer. In either case, when the width of the die, $w_d$, is small relative to the thickness, t1, of the wafer, "scribe and cleave" tends to become unreliable and the dice may fail to separate as desired. In one embodiment, a ratio of $W_d$ to t1 of at least 2 to 1 is acceptable.

As described above, substrate 200 may have at thickness t1 ranging from approximately 380 to 750 µm (16 to 30 mils), and the width of each FBAR filter, $w_d$ (FIG. 9), is approximately 1000 µm (1 mm). To overcome the problems associated with the use of a "scribe and cleave" step, substrate 200 can be thinned prior to die separation. This thinning may be accomplished using lapping, a plasma etch, or a chemical mechanical polishing (CMP) process to remove material from the underside 218 of substrate 200.

The polishing of underside 218 of substrate 200 creates additional problems due to the fragile nature of FBAR membrane 217. In the polishing process, underside 218 of substrate 200 is placed against a rotating polishing surface in the presence of a polishing slurry, and a pressure is applied to the upper surface 220. This pressure facilitates the removal of material from underside 218. To prevent damage, the remaining portions 210 of sacrificial PSG layer 208 may be left in cavities 204 to provide structural support for FBAR membranes 217 while substrate 200 is thinned.

Figure 7:
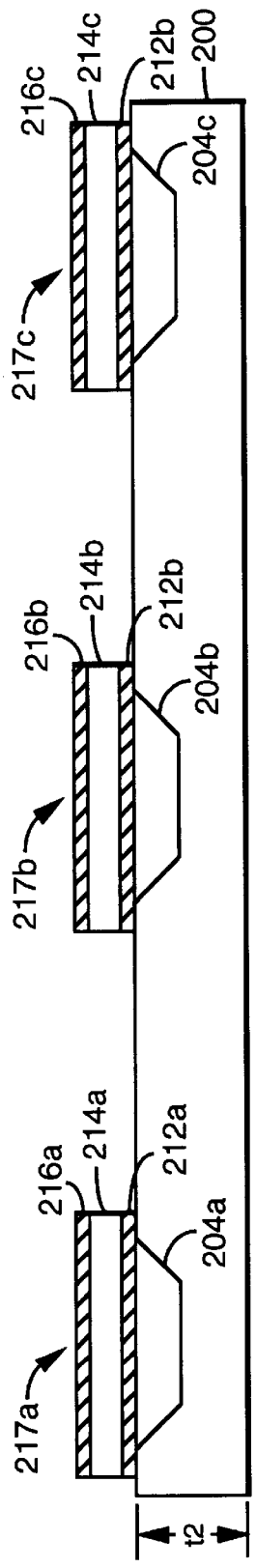

FIG. 7 shows substrate 200 after thinning. In one embodiment, thinned thickness, t2, equals approximately 5 mils, which provides good characteristics for FBAR membranes 217, yet is sufficiently thick such that substrate 200 maintains sufficient rigidity for later processing steps. In other embodiments, t2 may range from 1 to 10 mils. Thicknesses t2 of 1 to 19 mils may also be acceptable, depending on the desired geometries.

After FBAR membranes 217a–217c are formed and substrate 200 is thinned, remaining portions 210a–210c of sacrificial layer 208 and thermal oxide layer 206 can be removed. To do this, vias (not shown) were created to expose the sacrificial PSG portions 210. These remaining sacrificial PSG portions 210 and thermal oxide layer 206 are removed by etching in dilute $H_2O$:HF solution. As shown in FIG. 7, this leaves FBARs membranes 217a–217c suspended over the original cavities 204a–204c.

The above example has utilized the construction of FBAR membranes 217a–217c. However, it will be obvious to those skilled in the art from the preceding discussion that an SBAR membrane can be constructed utilizing the same process. In the case of an SBAR, an additional piezoelectric layer and electrode is deposited.

Figure 8:
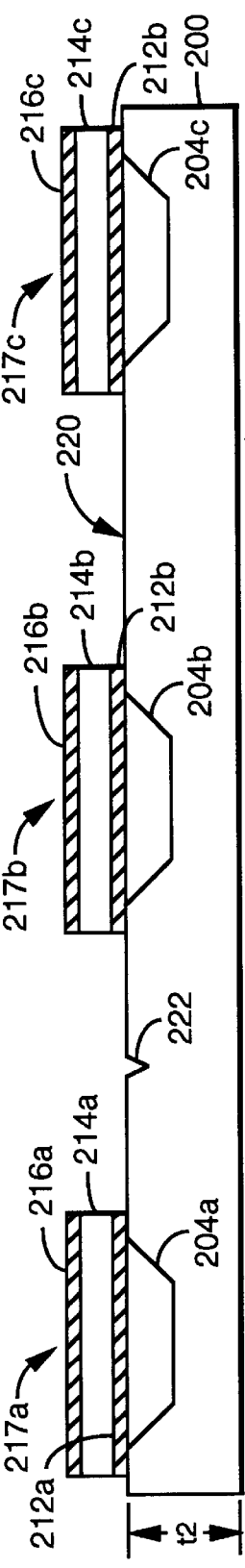

In the "scribe" step, a diamond-tip scribe is used to cut small grooves 222 in the upper surface 220 of substrate 200, as shown in FIG. 8. Next, a plastic layer (not shown) is placed over the upper surface 220. This plastic layer can be, for example, a non-adhesive polyimide tape having an electrical charge caused by static electricity.

Substrate 200 is then mounted onto a carrier comprising an adhesive tape extended across a set of hoops. The adhesive tape is bonded to the underside 218 of substrate 200, and an overlay may be provided over topside 220 of substrate 200 for additional support. Each groove 222 on substrate 200 is then impacted with a blade, thereby causing the dice to separate along the scribe lines defined by grooves 222. A wafer expander tool is used to stretch the adhesive tape, to which the separated dice are adhered, thereby providing easier handling of individual dice. The individual dice can then be removed and further processed, as described below.

During the "cleave" step, particles typically emanate from substrate 200 at the location of the break. If they adhere to FBAR membranes 217, these particles can damage or otherwise negatively impact the performance of FBAR membranes 217. The plastic layer effectively attracts and holds these particles due to their static charge, and prevents the particles from contacting any portion of FBAR membranes 217, particularly electrode layers 212, 216. After the separation of the dice, the plastic layer can be removed, thereby removing all of the particles attached to the plastic layer.

Figure 9:
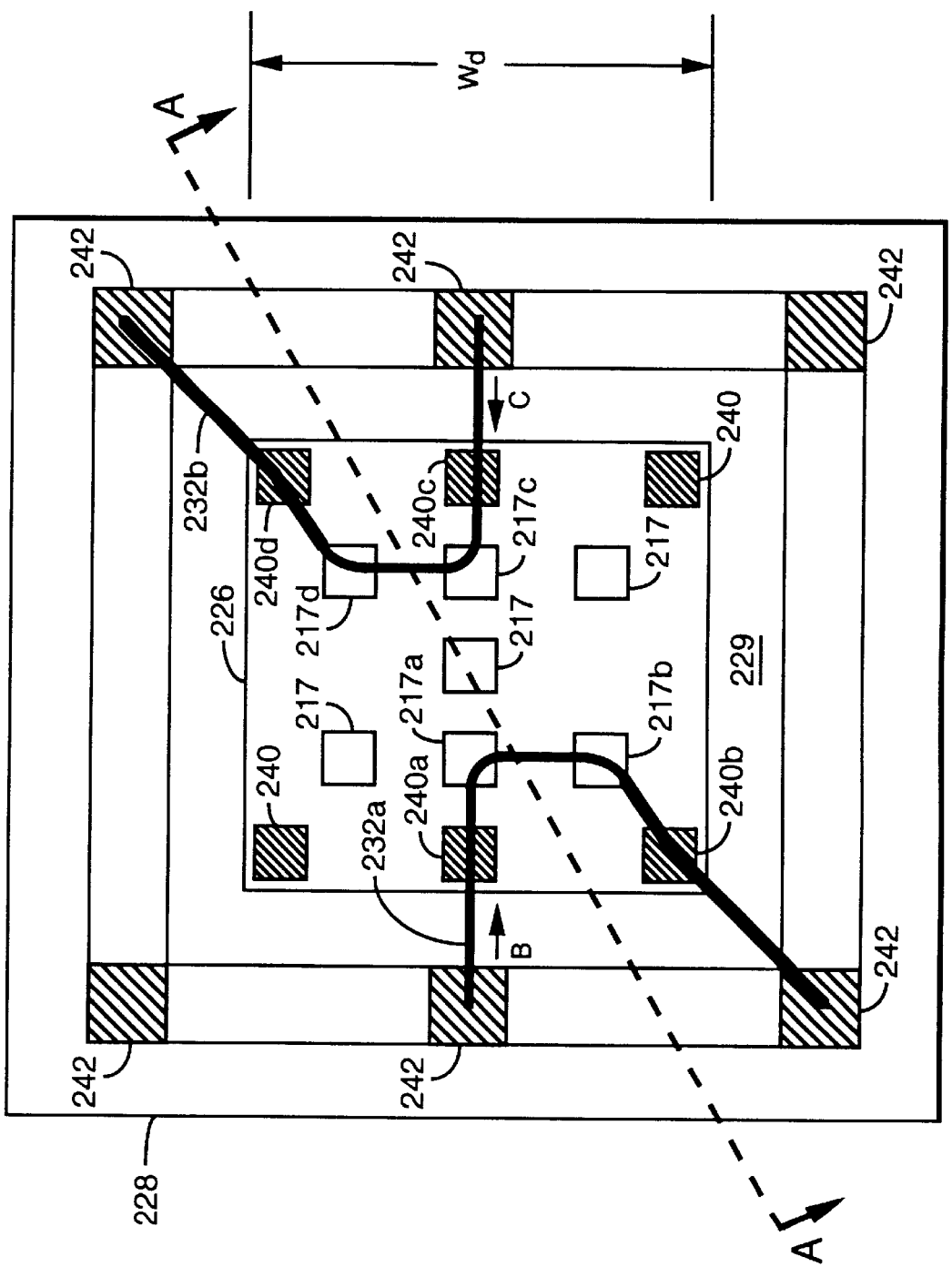
FIG. 9 is a top plan view of an induced current produced by an FBAR filter in accordance with an embodiment of the present invention.
Figure 10:
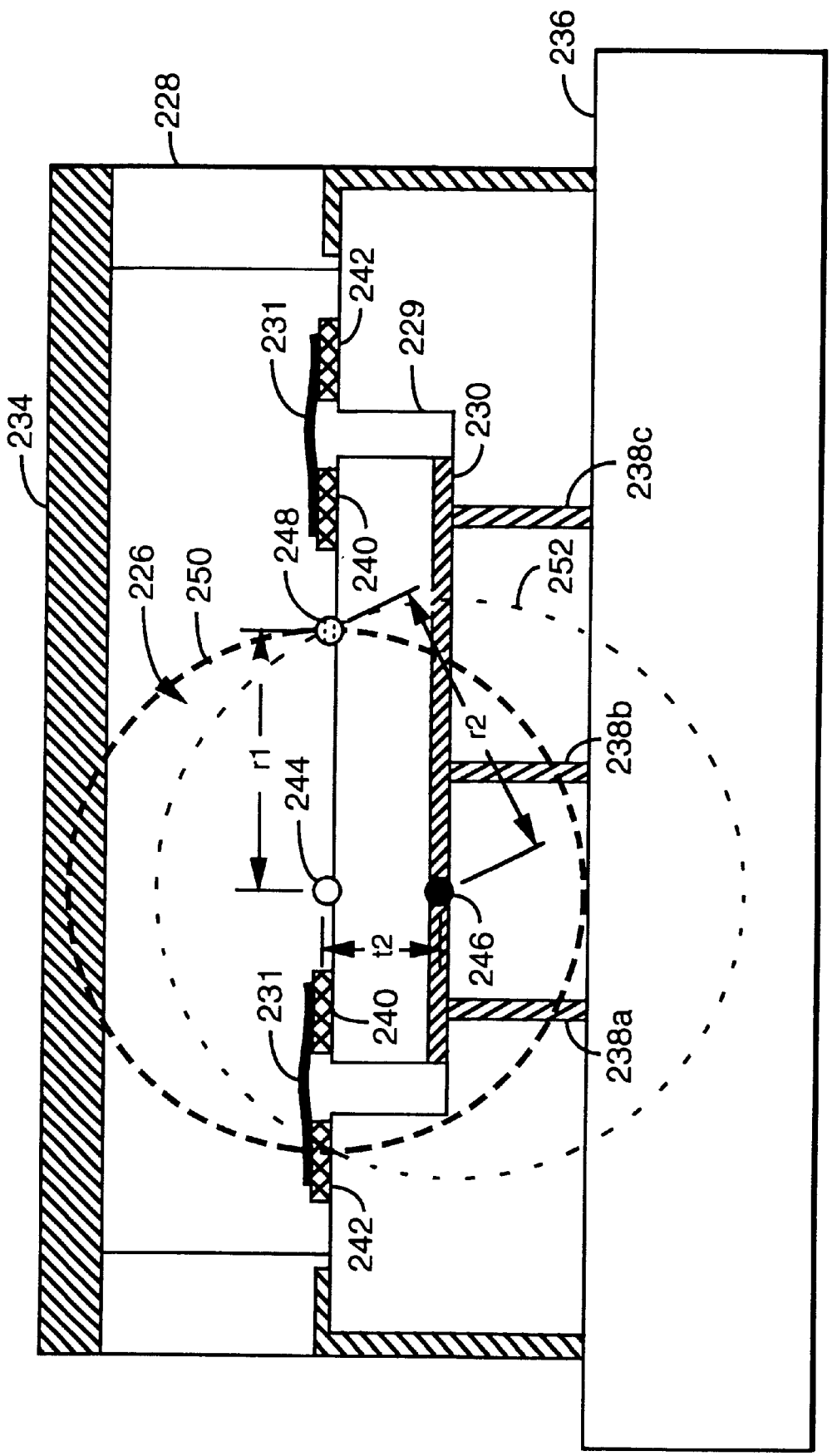
FIG. 10 is a cross-sectional view of a package containing an FBAR filter constructed according to an embodiment of the present invention.

Each separated die may have a plurality of FBAR resonators formed thereon and electrically connected with a plurality of interconnects. The die with FBAR resonators and interconnects together form a single FBAR filter 226. FBAR filter 226 may then be mounted into a die cavity 229 within a ceramic package 228, as shown in FIGS. 9–10. FIG. 9 shows a top view of FBAR filter 226 mounted in package 228, and FIG. 10 shows a cross-section of the structure shown in FIG. 9 taken along the line A—A.

FBAR filter 226 is bonded to package 228 using a thermally-conductive epoxy layer 230, and electrically-conductive bond wires 231 provide electrical connections between package 228 and FBAR filter 226. A cover 234 seals the top of package 228 after FBAR filter 226 is mounted. Package 228 can then be mounted onto a printed circuit board 236 using conventional surface mount solder techniques.

When FBAR filter 226 is in use, a significant amount of power is provided to FBAR filter 226, causing heat to be generated. In one embodiment, package 228 is provided with one or more thermal vias 238a–238c, which are used to carry heat away from FBAR filter 226 to printed circuit ("PC") board 236. Epoxy bond layer 230 is also thermally-conductive, which improves the heat flow from substrate 200 to thermal vias 238a–238c. PC board 236 dissipates the heat drawn from device 226 using, for example, additional thermal vias and traditional convection cooling. Decreasing the thickness of substrate 200 prior to use effectuates improved heat transfer from FBAR membranes 217 by reducing the thermal resistivity of substrate 200. Thus, heat is able to more easily flow from FBAR membranes 217 to PC board 236.

Another advantage provided by embodiments of the present invention is the improved reduction of electromagnetic influence caused by the currents flowing through FBAR filter 226. One important property of a filter is that outside of the frequencies of interest, the FBAR membranes attenuate the amount of energy coming through the filter. The amount of attenuation at frequencies outside the passband should be as much as 50 dB, in some cases.

This filtering property is compromised if there is a "path" from input to output such that the signal bypasses the filter elements. One such path is created by the mutual inductance formed between a first loop (the "victimizer" loop) formed by the input signal pad 240$a$ and the first ground pad 240$b$ via FBAR resonators 217$a$ and 217$b$, and a second loop (the "victim" loop) at the output formed by the path between output pad 240$c$ to ground pad 240$d$ a FBAR resonators 217$c$ and 217$d$. One aspect that mitigates this "parasitic" path is the creation of an image current underneath the signal loop (the "victimizer" loop) in a ground plane 230 (FIG. 10).

As can be seen in FIG. 9, package 228 includes a plurality of contacts 242 which are electrically connected with contacts 240 on FBAR filter 226. Contacts 240 are, in turn, electrically connected with FBAR membranes 217 on FBAR filter 226. These electrical connections create multiple current flows over the surface of FBAR filter 226, two of which, current loops 232$a$ and 232$b$, are illustrated in FIG. 9. Current loop 232$a$ (the "victimizer" current), which flows in the direction of arrow B, induces an image current in the ground plane 230 directly underneath FBAR filter 226. This image current follows the path of current loop 232$a$ but flows in the opposite direction. Current loop 232$a$ also induces a sympathetic current 232$b$ (the "victim" loop).

FIG. 10 shows primary current point 244, which is the point where "victimizer" current loop 232$a$ intersects line A—A. Image current point 246 is the point where the image current of the "victimizer" current loop 232$a$ intersects line A—A. Also shown in FIG. 10 is point 248 of the "victim" loop, which is the point where current is induced in the "victim" loop 232$b$ by the "victimizer" current loop 232$a$. The opposing electrical currents flowing through primary current point 244 and image current point 246 create opposing electromagnetic fields, shown as primary current magnetic field 250 and image current magnetic field 252. Each of these magnetic fields 250 and 252 induce a current flow at "victim" loop point 248. However, the distance r1 between primary current point 244 and victim current point 248 is less than the distance r2 between image current point 246 and victim current point 248. Therefore, the induced magnetic fields 250 and 252 are of unequal magnitudes at point 248, thus inducing a current in the output loop 232$b$.

In accordance with embodiments of the present invention, substrate 200 is thinned before being separated into individual dice. This thinning process reduces the distance t2 between the primary current point 244 and the image current point 246. As t2 is reduced to a distance much smaller than r1, then the magnitude of primary current magnetic field 250 will approach the magnitude of image current magnetic field 252. Because the primary current flowing through primary current point 244 and the image current flowing through image current point 246 are in opposite directions, image current magnetic field 252 will serve to cancel out primary current magnetic field 250. Accordingly, as the distance t2 is reduced, the magnitudes of magnetic fields 250 and 252 will approach each other, and the cancellation of magnetic fields 250 and 252 will be more complete. This minimizes the amount of current induced in "victim" current loop 232$b$, which improves the overall efficiency of package 228.

It will be understood that multiple current paths exist on the surface of FBAR filter 226, which creates an equal number of image current paths in the ground plane beneath FBAR filter 226. All of these currents will create magnetic fields which will affect nearby current flows to varying degrees. By decreasing the thickness t2 of substrate, the image currents in the ground plane will be brought closer to the corresponding currents flowing on the upper surface of FBAR filter 226.

Separation between "victim" and "victimizer" loops is typically on the order of 300 to 500 $\mu$m (12 to 20 mils). It is generally desirable to reduce the distance between these loops in order to obtain smaller die sizes and higher yields. Accordingly, it is desirable to reduce the thickness of the substrate to at least one-third of the distance between the "victim" and "victimizer" loops. This improves the ability of the image currents to induce magnetic fields which tend to cancel out the magnetic fields caused by the primary currents.

As described above, embodiments of the present invention provide numerous advantages. Thinning of substrate 200 after the formation of FBAR membrane 217 provides improvements in both the thermal and electrical efficiency of FBAR filter 226. Because FBAR membrane 217 is formed prior to the thinning of substrate 200, substrate 200 is structurally stronger and less fragile during the manufacturing of FBAR membrane 217. In addition, by retaining sacrificial PSG portion 210 in cavity 204 during the processing, sacrificial PSG portion 210 provides structural support for FBAR membrane 217. Moreover, the thinning of substrate 200 may be part of a batch process for simultaneously forming a plurality of FBAR membranes 217 on a single wafer, thereby increasing manufacturing efficiency. The above-described advantages of thinning substrate 200 are not limited to the specific FBAR fabrication process described herein, but may be applied to any process of manufacturing FBAR resonators and filters. Another method of manufacturing FBARs is disclosed in U.S. Pat. No. 5,873,153 to Ruby et al., incorporated herein by reference in its entirety.

The advantage achieved by thinning substrate 200 as described above is not limited to the specific FBAR structure described herein, but is also applicable to other FBAR and surface acoustic wave (SAW) structures. Another method of manufacturing FBARs to which the thinning of substrate step may be applied is discussed in U.S. Pat. No. 5,873,153 to Ruby et al., which is incorporated herein by reference in its entirety.

Although the invention has been described with reference to particular embodiments, the description is only an example of the invention's application and should not be taken as a limitation. In particular, even though much of preceding discussion was aimed at the manufacturing of FBAR filters, alternative embodiments of this invention are applicable to the manufacturing of SBAR devices or other thin film filter technologies. Various other adaptations and combinations of features of the embodiments disclosed are within the scope of the invention as defined by the following claims.

What is claimed is:

1. A method for batch processing acoustic resonators, comprising:

depositing a first electrode on a top surface of a substrate;

depositing a layer of piezoelectric material on said first electrode;

depositing a second electrode on said layer of piezoelectric material; and removing material from a bottom surface of said substrate to reduce the thickness of the substrate and to reduce an electromagnetic influence in a resulting filter.

2. The method of claim 1, further comprising:

prior to depositing said first electrode, forming a plurality of depressions in the top surface of said substrate;

depositing a sacrificial material in each of said depressions, wherein said first electrode is deposited on top of said sacrificial material; and removing said sacrificial material.

3. The method of claim 1, wherein said first and second electrodes are comprised of molybdenum.

4. The method of claim 1, further comprising:

scribing said top surface of said substrate; and dividing said substrate along said scribe lines to form a plurality of dice.

5. The method of claim 4, further comprising, for each die in said plurality of dice, mounting said die in a die cavity of a package to produce an individual, packaged filter, said die being mounted in said die cavity such that a bottom surface of said die is in thermal communication with a thermal via in said package.

6. The method of claim 5, wherein said step of mounting said die into said die cavity in said package comprises:

depositing a thermally-conductive epoxy in said die cavity in said package; and mounting said die onto an upper surface of said thermally-conductive epoxy, wherein a lower surface of said thermally-conductive epoxy is in contact with said thermal via.

7. The method of claim 5, wherein the filter has an aspect ratio for a distance between a victim loop and a victimizer loop of the filter to the thickness of said substrate is at least 3:1.

8. The method of claim 4, further comprising:

prior to dividing said substrate along said scribe lines to form said plurality of dice, depositing a protective layer over said top surface of said substrate.

9. The method of claim 1, wherein said step of removing material from the bottom surface of said substrate comprises thinning said substrate to a thickness of less than 19 mils.

10. The method of claim 1, wherein said step of removing material from the bottom surface of said substrate comprises:

placing the bottom surface of said substrate against a polishing surface; and polishing the bottom surface to remove material therefrom.

11. A method for batch processing acoustic resonators, comprising:

forming a plurality of depressions in a top surface of a substrate;

depositing a sacrificial material in each of said depressions;

depositing a first electrode on an upper surface of said sacrificial material in each of said depressions;

depositing a layer of piezoelectric material on said first electrode;

depositing a second electrode on said layer of piezoelectric material; and polishing a bottom surface of said substrate to reduce the thickness of said substrate.

12. The method of claim 11, further comprising removing said sacrificial material after polishing the bottom surface of said substrate.

13. The method of claim 11, wherein the substrate is polished to a thickness of less than 19 mils.

14. The method of claim 11, further comprising:

scribing the top surface of said substrate;

dividing said substrate along said scribe lines to form a plurality of dice; and for each die in said plurality of dice, mounting said die in a die cavity of a package to produce an individual, packaged filter, said die being mounted in said die cavity such that a bottom surface of said die is in thermal communication with a thermal via in said package.

15. The method of claim 14, wherein the filter has an aspect ratio for a distance between a victim loop and a victimizer loop of the filter to the thickness of said substrate is at least 3:1.

16. An acoustic filter, comprising:

a die substrate having a thickness of less than 19 mils;

a plurality of acoustic resonators formed on a top surface of the substrate, each acoustic resonator including first and second electrodes and a piezoelectric material disposed in between the first and second electrodes;

a plurality of interconnects providing electrical connections to said plurality of acoustic resonators; and a package having a die cavity formed therein, said die substrate being mounted in said die cavity such that a primary current flowing along an upper surface of said die substrate creates a primary current magnetic field, and an image current flowing along a ground plane beneath said die substrate creates an image current magnetic field, said primary current magnetic field and said image current magnetic field having opposite polarities.

17. The acoustic filter of claim 16, wherein said die substrate has a thickness in the range of 3 mils to 7 mils.

18. The acoustic filter of claim 16, wherein an aspect ratio for a distance between a victim loop and a victimizer loop of the filter to the thickness of said substrate is at least 3:1.

19. The acoustic filter of claim 16, wherein the die substrate has a plurality of depressions formed therein, each of the plurality of acoustic resonators being disposed above a respective depression in the die substrate.

20. The acoustic filter of claim 16, wherein said package has at least one thermal via, said die substrate being mounted in said package such that a bottom surface of said die substrate is in thermal communication with said at least one thermal via, said die substrate being affixed to said package using a thermally-conductive epoxy.

* * * * *